United States Patent
Doi et al.

(10) Patent No.: US 9,799,821 B2
(45) Date of Patent: Oct. 24, 2017

(54) SILICON SUBSTRATE HAVING FERROELECTRIC FILM ATTACHED THERETO

(71) Applicant: MITSUBISHI MATERIALS CORPORATION, Tokyo (JP)

(72) Inventors: Toshihiro Doi, Naka (JP); Hideaki Sakurai, Naka (JP); Nobuyuki Soyama, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/890,518

(22) PCT Filed: May 1, 2014

(86) PCT No.: PCT/JP2014/062039
§ 371 (c)(1),
(2) Date: Nov. 11, 2015

(87) PCT Pub. No.: WO2014/185274
PCT Pub. Date: Nov. 20, 2014

(65) Prior Publication Data
US 2016/0087192 A1    Mar. 24, 2016

(30) Foreign Application Priority Data
May 13, 2013 (JP) ................... 2013-100967

(51) Int. Cl.
*B32B 3/00* (2006.01)
*H01L 41/187* (2006.01)
(Continued)

(52) U.S. Cl.
CPC ...... *H01L 41/1876* (2013.01); *C23C 18/1216* (2013.01); *C23C 18/1254* (2013.01);
(Continued)

(58) Field of Classification Search
CPC ............. H01L 41/1876; H01L 41/0815; H01L 41/318; H01L 41/319; H01L 21/02197;
(Continued)

(56) References Cited

U.S. PATENT DOCUMENTS

2009/0114875 A1* 5/2009 Arakawa ............... C04B 35/491
252/62.9 PZ

FOREIGN PATENT DOCUMENTS

JP    2004-119703 A    4/2004
JP    2004-119703 A    4/2004
(Continued)

OTHER PUBLICATIONS

H. Kozuka et al., "PVP-assisted sol-gel deposition of single layer ferroelectric thin films over submicron or micron in thickness," Journal of the European Ceramic Society 24, 2004, pp. 1585-1588.
(Continued)

*Primary Examiner* — Elizabeth Mulvaney
(74) *Attorney, Agent, or Firm* — Locke Lord LLP

(57) ABSTRACT

A residual stress in a PZT type ferroelectric film 12 formed on a substrate body 11 by a sol-gel process is −14 MPa to −31 MPa, and the ferroelectric film 12 is crystal oriented in a (100) plane.

7 Claims, 3 Drawing Sheets

(51) Int. Cl.
  C23C 18/12       (2006.01)
  H01L 49/02       (2006.01)
  H01L 41/318      (2013.01)
  H01L 41/319      (2013.01)
  H01L 21/02       (2006.01)
  H01L 27/108      (2006.01)
  H01L 27/11507    (2017.01)
  H01L 29/51       (2006.01)
  H01L 37/02       (2006.01)
  H01L 41/08       (2006.01)

(52) U.S. Cl.
  CPC .. H01L 21/02197 (2013.01); H01L 21/02282 (2013.01); H01L 27/10805 (2013.01); H01L 27/11507 (2013.01); H01L 28/55 (2013.01); H01L 29/516 (2013.01); H01L 29/517 (2013.01); H01L 37/025 (2013.01); H01L 41/0815 (2013.01); H01L 41/318 (2013.01); H01L 41/319 (2013.01)

(58) Field of Classification Search
  CPC . H01L 21/02282; H01L 28/55; H01L 29/526; H01L 29/527; C23C 18/1216; C23C 18/1254
  See application file for complete search history.

(56) References Cited

FOREIGN PATENT DOCUMENTS

| | | |
|---|---|---|
| JP | 2004-282913 A | 10/2004 |
| JP | 2005-119166 A | 5/2005 |
| JP | 2006-319945 A | 11/2006 |
| JP | 2007-123683 A | 5/2007 |
| JP | 2007-335779 A | 12/2007 |
| JP | 2008-042069 A | 2/2008 |
| JP | 2008-042069 A | 2/2008 |
| JP | 2009-123972 A | 6/2009 |
| JP | 2012-009800 A | 1/2012 |
| JP | 2012-235004 A | 11/2012 |

OTHER PUBLICATIONS

Jong-Jin Choi et al., "Sol-Gel Preparation of Thick PZN-PZT Film Using a Diol-Based Solution Containing Polyvinylpyrrolidone for Piezoelectric Applications," Journal of the American Ceramic Society, 88(11), 2005, pp. 3049-3054.

Notification of Reasons for Refusal mailed Oct. 18, 2016, issued for the Japanese patent application No. 2013-100967 and English translation thereof.

Toshihiro Doi et al., "Stress development on Fabrication of Sol-Gel Derived PbZr$_x$Ti$_{1-x}$O$_3$ Films", The 60th Spring Meeting in the Japan Society of Applied Physics, lecture proceedings, Mar. 11, 2013, 06-021, 28P-D3-2 and English translation thereof.

International Search Report mailed Aug. 5, 2014, issued for PCT/JP2014/062039.

The extended European search report dated Dec. 15, 2016 issued for corresponding European Patent Application No. 14798304.3.

Office Action dated on Mar. 22, 2017 issued for corresponding Chinese Patent Application No. 2014 800 15888.4.

Notification of Reasons for Refusal drafted on Mar. 28, 2017 issued for corresponding Japanese Patent Application No. 2013-100967.

Office Action dated on Jun. 16, 2017 issued for corresponding Taiwanese Patent Application No. 103115358.

\* cited by examiner

SILICON SUBSTRATE HAVING FERROELECTRIC FILM ATTACHED THERETO

TECHNICAL FIELD

The present invention relates to a silicon substrate in which a lead zirconate titanate (PZT) type ferroelectric film has been formed on a substrate body made of silicon by a sol-gel process. Incidentally, the present international application claims a priority of Japanese Patent Application No. 100967 (JP 2013-100967) filed on May 13, 2013, and the whole content of JP Application No. 2013-100967 is incorporated into this International Application by reference.

BACKGROUND ART

A silicon substrate in which a ferroelectric film has been formed on this kind of substrate body by a sol-gel process has heretofore been used for a composite electronic component such as a thin film capacitor, a capacitor, IPD (Integrated Passive Device), etc. In the method for forming the ferroelectric film on the above-mentioned conventional substrate body by the sol-gel process, however, there are problems that shrinkage of the film is generated at the time of forming the ferroelectric film on the substrate body, and the silicon substrate is markedly warped after formation of the ferroelectric film due to the difference in thermal expansion coefficients between the substrate body and the ferroelectric film. In addition, if the warpage of the silicon substrate is too remarkable, there is a problem that a thicker ferroelectric film cannot be formed since temperature unevenness is generated at the time of baking the ferroelectric film, whereby unevenness in residual stress is generated in the ferroelectric film.

To solve the above-mentioned problems, there has been disclosed a ferroelectric thin film in which an electrode layer (a first layer or an electric circuit layer) and a PZT layer (ferroelectric layer) are formed on the surface (one surface) of the substrate, and a stress balancing layer (a second layer or a stress relief layer) is formed on the back surface (the other surface) thereof (for example, see Patent Document 1.). In this ferroelectric thin film, a material made of Si on the surface of which has been formed a Si oxidized film is used as a substrate. The electrode layer comprises a base layer comprising Ti, and an electrode pattern layer comprising Pt formed on the base layer with a predetermined electrode pattern, and a thickness of the base layer is made to be about 50 nm and a thickness of the electrode pattern layer is made to be about 200 nm. As the base layer, $TiO_2$ may be used. The PZT layer is formed by a material containing Pb, Zr and Ti, which is formed with a thickness of about 100 nm to 5 µm and in a crystallized state. The PZT layer can realize the above-mentioned thickness by laminating thin films each having 120 to 130 nm per layer with a plural number of layers.

For forming the ferroelectric thin film constituted as mentioned above, Ti which forms a base layer of the electrode layer and Pt which forms an electrode pattern layer are successively formed as films on the surface of a substrate (one surface) which had been formed by using the conventionally known Si substrate manufacturing techniques, etc., by the means of a sputtering method, etc. In addition, the stress balancing layer is also formed by forming Ti which forms a Ti layer and Pt which forms a Pt layer successively at the back surface (the other surface) of the substrate by the means of sputtering, etc. Then, the PZT layer is so formed that it covers the electrode layer. For forming the PZT layer, a sol-gel solution containing Pb, Zr and Ti with a predetermined formulation ratio is firstly coated on the electrode layer by means of a spin coating method, etc. Next, the sol-gel solution coated on the electrode layer is dried by holding it at 100 to 150° C. for 2 minutes, then, thermally decomposed by holding the same at 200 to 450° C. for 5 minutes, and further subjecting to heat treatment which holds at 550 to 800° C. for 1 to 10 minutes to crystallize the same. Thus, the PZT layer with a predetermined thickness is formed by subjecting to coating, drying, thermal decomposition and heat treatment of the sol-gel solution repeatedly with a plural number of times, and laminating a plural number of layers.

In the thus formed ferroelectric thin film, warpage of the ferroelectric thin film can be suppressed by providing a stress balancing layer (a second layer or a stress relief layer), since the residual stress of the electrode layer (a first layer or an electric circuit layer) and the PZT layer (ferroelectric layer) can be cancelled and relaxed. As a result, crack, peeling, etc., of the PZT layer (ferroelectric layer) can be prevented. More specifically, when the stress balancing layer is employed, the residual stress in the state of the ferroelectric thin film after forming the PZT layer can be suppressed to a lower range of 43.2 MPa to 139.3 MPa.

PRIOR ART DOCUMENT

Patent Document

Patent Document 1: JP 2007-123683A (Paragraphs [0012] to [0016], [0019], [0020], [0035], FIG. 1, FIG. 5)

SUMMARY OF THE INVENTION

Problems to be Solved by the Invention

In the ferroelectric thin film disclosed in the above-mentioned conventional Patent Document 1, however, a stress balancing layer comprising a Ti layer and a Pt layer must be formed at the back surface which is an opposite side to the substrate surface on which a PZT layer has been formed to suppress warpage of the ferroelectric thin film by the sputtering method, etc., whereby there is the defect that manufacturing processes increase. In addition, in the above-mentioned conventional ferroelectric thin film disclosed in Patent Document 1, there is the problem that a residual tensile stress in the state of the ferroelectric thin film after forming the PZT layer is still as large as 43.2 MPa to 139.3 MPa.

An object of the present invention is to provide a ferroelectric film-attached silicon substrate which can suppress warpage generating at the silicon substrate by reducing the residual stress in the ferroelectric film without forming a stress balancing layer on the back surface of the substrate body which is the opposite side of the surface of the substrate body on which the ferroelectric film is to be formed.

Means to Solve the Problems

The first aspect of the present invention is directed to a ferroelectric film-attached silicon substrate which comprises a PZT type ferroelectric film formed on a substrate body by a sol-gel process, a residual stress of which being −14 MPa to −31 MPa, and the ferroelectric film being crystal oriented in a (100) plane.

The second aspect of the present invention is an invention based on the first aspect of the invention, wherein a thickness of the ferroelectric film is 860 nm or more and 10,060 nm or less.

The third aspect of the present invention is an invention based on the first or the second aspect of the invention, wherein a diameter of the substrate body is 4 inches or more and 8 inches or less.

Effects of the Invention

In the ferroelectric film-attached silicon substrate of the first aspect of the present invention, a residual stress in the ferroelectric film on the substrate body is 14 MPa to 31 MPa in the absolute value, and the ferroelectric film is crystal oriented in the (100) plane, so that it is small as compared with the conventional ferroelectric thin film having a residual stress of 43.2 MPa to 139.3 MPa in the absolute value. As a result, warpage generating at the silicon substrate can be suppressed than the conventional materials. In addition, as compared with the conventional ferroelectric thin film manufacturing processes of which increase since a stress balancing layer is formed at the back surface which is an opposite side of the substrate surface on which the PZT layer has been formed by the sputtering method, etc., in the present invention, the residual stress generating at the ferroelectric film can be reduced without forming the above-mentioned stress balancing layer, i.e., the residual stress generating at the ferroelectric film can be reduced without increasing the manufacturing processes.

EMBODIMENTS TO CARRY OUT THE INVENTION

Figure 1:
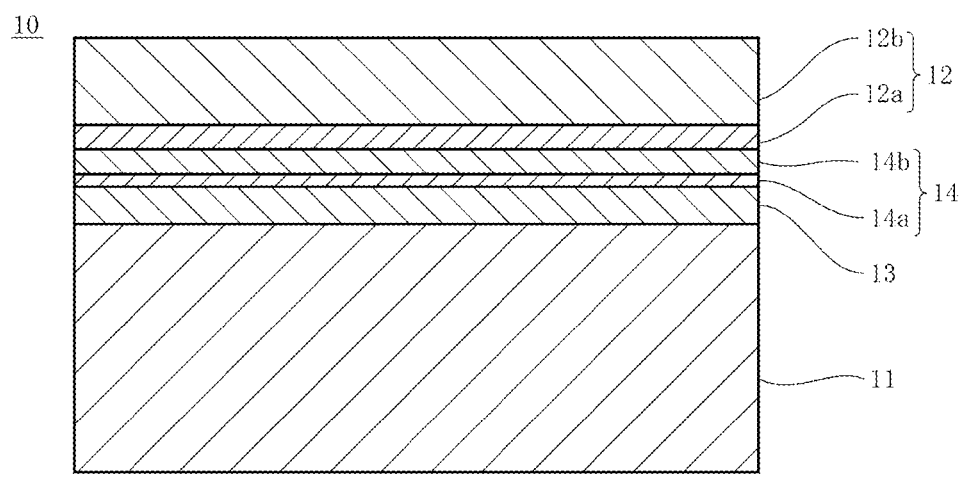
FIG. 1 is a cross-section constituting drawing showing the first embodiment of the present invention and the ferroelectric film-attached silicon substrate of Example 1.

Next, embodiments to carry out the present invention are explained by referring to the drawings.

First Embodiment

As shown in FIG. 1, the ferroelectric film-attached silicon substrate 10 is equipped with a substrate body 11 and a ferroelectric film 12 formed by the sol-gel process on the substrate body 11. A residual stress in the ferroelectric film 12 is −14 MPa to −31 MPa, and the absolute value of the residual stress is preferably as small as possible. The ferroelectric film 12 is also crystal oriented in the (100) plane. Here, the negative sign "−" attached before the above-mentioned residual stress means that a tensile stress acts on the ferroelectric film 12, and the surface on which the ferroelectric film 12 has been formed among the both surfaces of the silicon substrate is concave. When the positive sign "+" is attached before the above-mentioned residual stress, a compressive stress acts on the ferroelectric film 12, and the surface on which the ferroelectric film 12 has been formed among the both surfaces of the silicon substrate is convex. In addition, the reason why the residual stress in the ferroelectric film 12 is limited within the range of −14 MPa to −31 MPa is that if it is less than 14 MPa (the absolute value), the dielectric constant is reduced, while if it exceeds 31 MPa (the absolute value), warpage of the silicon substrate 10 is too remarkable and it is difficult to accurately carry out the patterning of an electrode, etc., in the later processing.

On the other hand, the ferroelectric film 12 is constituted by a composite metal oxide having a Perovskite structure containing Pb such as lead zirconate titanate (PZT), etc., and in addition to the PZT, PLZT in which an La element is added to the PZT is contained. The reason why the ferroelectric film 12 is crystal oriented in the (100) plane is that the inventors obtained the finding that stress relaxation due to phase transition (structural phase transition) of the crystals at the time of lowering the temperature after baking of the ferroelectric film 12 is larger than the case where it is crystal oriented in the other plane so that the residual stress in the ferroelectric film 12 can be reduced. Also, the ferroelectric film 12 has an orientation control film 12a in which crystal orientation is preferentially controlled in a (100) plane, and a thickness adjusting film 12b which adjusts a thickness of the whole ferroelectric film 12 and has the same crystal orientation as that of the orientation control film 12a. The orientation control film 12a is formed by using a sol-gel solution for controlling orientation mentioned later, and the thickness adjusting film 12b is formed by using the composition in which polyvinylpyrrolidone (PVP) or polyethylene glycol is added to a sol-gel solution for adjusting thickness as a stress relaxation agent. An average particle diameter of the crystal particles constituting the ferroelectric film 12 is relatively large, and is preferably 100 nm to 1,000 nm, more preferably 500 nm to 700 nm. Here, the reason why the average particle diameter of the crystal particles constituting the ferroelectric film 12 is limited into the range of 100 nm to 1,000 nm is that if it is less than 100 nm, a volume ratio at the grain boundary of the crystal particles becomes large so that electric characteristics are lowered, while if it exceeds 1,000 nm, it is difficult to uniformly carry out the patterning of an electrode, etc., in the later processing. Incidentally, crystal orientation of the ferroelectric film 12 is measured by using X-ray diffraction (XRD). In addition, an average particle diameter of the crystal particles of the ferroelectric film 12 can be obtained by photographing the surface of the ferroelectric film 12 by a scanning type electron microscope (SEM: S-900): manufactured by Hitachi High-Technologies Corporation), selecting optional 30 crystal particles in the picture of the electron microscopic photograph (surface image), measuring particle diameters (the maximum diameter and the minimum diameter) of these crystal particles by slide calipers, and calculating an average value thereof.

On the other hand, the substrate body 11 is formed by silicon (Si), and a diameter thereof is preferably in the range of 4 inches or more and 8 inches or less. Here, the reason why the diameter of the substrate body 11 is limited into the range of 4 inches or more and 8 inches or less is that the substrate body 11 within such a numerical range has now been used, or there is a possibility of using the same in the near future.

A total thickness of the orientation control film 12a and the thickness adjusting film 12b, i.e., the thickness of the ferroelectric film 12 is preferably 860 nm or more and 10,060 nm or less, more preferably 1,000 nm or more and 3,000 nm or less. Here, the reason why the thickness of the ferroelectric film 12 is limited into the range of 860 nm or more and 10,060 nm or less is that if it is less than 860 nm, it does not act as a piezoelectric material sufficiently, while if it exceeds 10,060 nm, a film forming time becomes long whereby the manufacturing cost increases. Further, the thickness of the orientation control film 12a is preferably set in the range of 35 nm to 150 nm. Here, the reason why the thickness of the orientation control film 12a is limited into the range of 35 nm to 150 nm is that if it is out of the range, it becomes the other orientations such as a (110) plane orientation, etc., other than the (100) plane orientation. Incidentally, between the substrate body 11 and the ferroelectric film 12, an $SiO_2$ film 13 and a lower electrode 14 are provided in this order from the substrate body 11 side. The lower electrode 14 is formed of a material having conductivity such as Pt, TiOx, Ir, Ru, etc., and which does not react with the ferroelectric film 12. The lower electrode 14 can be made, for example, to be a two-layer structure of a $TiO_X$ film 14a and a Pt film 14b in this order from the substrate body 11 side. Specific examples of the above-mentioned $TiO_X$ film may be mentioned as a $TiO_2$ film. Moreover, the above-mentioned $SiO_2$ film 13 is formed for improving adhesiveness.

Next, specific forming methods of the ferroelectric film 12 for reducing the residual stress at the inside thereof within the range of −14 MPa to −31 MPa are explained. The forming methods of the ferroelectric film 12 of the present invention are, however, not particularly limited by the following method. First, the orientation control film 12a among the ferroelectric film 12 is formed by coating a commercially available sol-gel solution obtained by mixing a PZT precursor with a solvent such as butanol, etc., on a Pt film 14b, drying and calcinating the same. Next, the thickness adjusting film 12b among the ferroelectric film 12 is formed by coating a sol-gel solution containing a PZT precursor, a diol, polyvinylpyrrolidone (PVP) or polyethylene glycol, water and a linear monoalcohol with a predetermined ratio, on the orientation control film 12a, drying, calcinating and further baking the same. According to this procedure, the residual stress in the ferroelectric film 12 becomes small as −14 MPa to −31 MPa, and the ferroelectric film 12 is crystal oriented in the (100) plane.

Next, a method for forming the orientation control film 12a among the ferroelectric film 12 for reducing the residual stress at the inside thereof into the range of −14 MPa to −31 MPa by using a sol-gel solution for controlling orientation is more specifically explained. First, the sol-gel solution for controlling orientation is coated on a Pt film 14b of the lower electrode 14 to form a coating film (a gel film) having a desired thickness. The coating method is not particularly limited, and may be mentioned a spin coating, a dip coating, an LSMCD (Liquid Source Misted Chemical Deposition) method or an electrostatic spraying method, etc. The coated film on the Pt film 14b is then subjected to drying and calcination in which it is held in an air atmosphere at 150 to 200° C. or 285 to 315° C. for 1 to 10 minutes, and further subjected to baking in which it is held in an air atmosphere at 450 to 800° C. for 1 to 60 minutes to crystallize the film. Here, the reason why the drying and calcination temperature is limited into the range of 150 to 200° C. or 285 to 315° C. is that a temperature at around 250° C. is not suitable as a heating temperature of the film, and an initial nucleus for crystal orientating the orientation control film 12a to the (100) plane at the interface between the Pt film 14b and the orientation control film 12a is not formed. In addition, the reason why the baking temperature is limited into the range of 450 to 800° C. is that if it is lower than 450° C., crystallization does not proceed sufficiently, while if it exceeds 800° C., the lower electrode 14 tends to be damaged. The above-mentioned drying and calcination or baking may be carried out by using a hot plate or rapid thermal annealing (RTA), etc. When baking is carried out by rapid thermal annealing (RTA), a temperature raising rate is preferably set to 10 to 100° C./sec.

As the sol-gel solution for controlling orientation for forming the above-mentioned orientation control film 12a, a PZT precursor is prepared depending on the desired composition of the PZT, and a commercially available sol-gel solution obtained by mixing the PZT precursor with a solvent such as butanol, 2-methoxyethanol, ethanol, etc., is preferably used. A concentration of the PZT precursor occupied in 100% by mass of the above-mentioned sol-gel solution for controlling orientation is 10 to 15% by mass in terms of an oxide concentration. Here, an oxide concentration in the concentration of the PZT precursor occupied in the sol-gel solution for controlling orientation means a concentration of a metal oxide occupied in 100% by mass of the sol-gel solution for controlling orientation, which is calculated by assuming that whole metal elements contained in the sol-gel solution for controlling orientation became the objective oxide. Also, the reason why the concentration of the PZT precursor occupied in 100% by mass of the sol-gel solution for controlling orientation is limited into the range of 10 to 15% by mass in terms of an oxide concentration is that if it is less than 10% by mass, a sufficient film thickness cannot be obtained, while if it exceeds 15% by mass, the film thickness becomes too thick and the aimed orientation cannot be obtained. Further, the PZT precursor contained in the above-mentioned sol-gel solution for controlling orientation is a raw material for constituting the above-mentioned composite metal oxide, etc., in the orientation control film 12a after the formation, and contained with such a ratio that these provide a desired metal atomic ratio. More specifically, it is preferred that x, y and z are set to the ratio that they give a metal atomic ratio satisfying $1.00<x<1.25$, $0 \leq y \leq 0.05$ and $0.4<z<0.6$ when they are represented by the general formula: $(Pb_xLa_y)(Zr_zTi_{1-z})O_3$. In addition, PMnZT in which an Mn element has been added, and PNbZT in which an Nb element has been added, etc., are also contained.

Next, a method for forming the thickness adjusting film 12b among the ferroelectric film 12 which is to reduce the residual stress at the inside thereof into the range of −14 MPa to −31 MPa by using the composition for forming the thickness adjusting film is explained more specifically. This forming method is a forming method of the thickness adjusting film 12b by the sol-gel process, and uses the above-mentioned composition for forming the thickness adjusting film or the composition for forming the thickness adjusting film produced by the above-mentioned method as a raw material solution. First, the above-mentioned composition for forming the thickness adjusting film is coated on the orientation control film 12a to form a coating film (a gel film) having a desired thickness. The coating method is not particularly limited, and may be mentioned a spin coating, dip coating, LSMCD (Liquid Source Misted Chemical Deposition) method or an electrostatic spraying method, etc.

As the composition (the composition for forming the thickness adjusting film) for forming the above-mentioned thickness adjusting film 12b, a composition in which polyvinylpyrrolidone (PVP) or polyethylene glycol is added to the sol-gel solution for adjusting thickness as a stress relaxation agent, i.e., a composition containing a PZT precursor, a diol, polyvinylpyrrolidone or polyethylene glycol, water and a linear monoalcohol is preferably used. A ratio of the above-mentioned diol in 100% by mass of the above-mentioned composition is preferably 16 to 56% by mass, a ratio of the above-mentioned polyvinylpyrrolidone or polyethylene glycol is preferably 0.01 to 0.25 mol in terms of a monomer based on 1 mol of the above-mentioned PZT precursor, and a ratio of the above-mentioned water is preferably 0.5 to 3 mol based on 1 mol of the above-mentioned PZT precursor.

The PZT precursor contained in the above-mentioned composition is a raw material for constituting the above-mentioned composite metal oxide, etc., in the thickness adjusting film 12b after formation thereof, and contained in such a ratio that these give a desired metal atomic ratio. More specifically, similarly to the above-mentioned orientation control film 12a, it is preferred that x, y and z are set to the ratio that they give a metal atomic ratio satisfying $1.00 < x < 1.25$, $0 \leq y \leq 0.05$ and $0.4 < z < 0.6$ when they are represented by the general formula: $(Pb_xLa_y)(Zr_zTi_{1-z})O_3$. Also, La in the above-mentioned formula is a metal dopant. Further, PMnZT in which an Mn element is added as a metal dopant, or PNbZT in which an Nb element is added as a metal dopant, etc., is also contained. By adding these metal dopants, effects of reduction in leakage current, improvement in dielectric constant, improvement in piezoelectric characteristics, improvement in mechanical quality coefficient, etc., can be obtained. Here, the mechanical quality coefficient means a constant showing sharpness of mechanical vibration in the vicinity of resonance frequency when the piezoelectric element, etc., caused natural vibration.

The PZT precursor suitably comprises a compound in which an organic group is bonded to the respective metal elements such as Pb, La, Zr, Ti, etc., through the oxygen or nitrogen atom. For example, the Pb compound may be mentioned lead acetate trihydrate, the La compound may be mentioned lanthanum acetate sesquihydrate, the Zr compound may be mentioned zirconium tetrabutoxide, and the Ti compound may be mentioned titanium tetraisopropoxide. In addition, the Mn compound may be mentioned manganese 2-ethylhexanoate and the Nb compound may be mentioned niobium pentaethoxide.

The diol contained in the composition is a component which becomes a solvent of the composition. More specifically, there may be mentioned propylene glycol, ethylene glycol or 1,3-propane diol, etc. Among these, propylene glycol or ethylene glycol is preferred. By using the diol as an essential solvent component, storage stability of the composition can be heightened. The reason why the ratio of the above-mentioned diol occupied in 100% by mass of the composition is made 16 to 56% by mass is that if it is less than the lower limit value, an inconvenience of generating a precipitate is likely caused, while if it exceeds the upper limit value, voids (micropores) are likely generated when the film is made thick. Among these, the ratio of the diol is preferably 28 to 42% by mass.

The above-mentioned composition also preferably contains polyvinylpyrrolidone (PVP) or polyethylene glycol which is a polymer compound. The polyvinylpyrrolidone and the polyethylene glycol are used for adjusting a liquid viscosity of the composition. In particular, the polyvinylpyrrolidone is used for adjusting a relative viscosity determined by a k value. Here, the k value means a viscosity characteristic value which correlates to a molecular weight, and a value calculated by applying a relative viscosity value (25° C.) measured by a capillary viscometer to the formula of Fikentscher. The k value of the polyvinylpyrrolidone contained in the above-mentioned composition is preferably 30 to 90. For forming the thickness adjusting film 12b having a thick thickness, it is necessary to have a sufficient viscosity necessary for maintaining the thickness of a coating film (a gel film) to be coated when the composition is coated to the substrate, etc., if the k value is less than the lower limit value, it can be difficulty obtained. On the other hand, if it exceeds the upper limit value, the viscosity becomes too high, and it is difficult to coat the composition uniformly. Here, the reason why the ratio of the polyvinylpyrrolidone or the polyethylene glycol is made 0.01 to 0.25 mol in terms of a monomer based on 1 mol of the above-mentioned PZT precursor is that if it is less than the lower limit value, crack is likely generated, while if it exceeds the upper limit value, voids are likely generated.

The above-mentioned composition contains water such as deionized water, ultrapure water, etc. By adding water to the composition with a predetermined ratio, the precursor is suitably hydrolyzed, whereby the effect that densification of a film structure of the thickness adjusting film 12b can be improved. The reason why the ratio of water is made 0.5 to 3 mol based on 1 mol of the above-mentioned PZT precursor is that if it is less than the lower limit value, inconveniences that hydrolysis is not sufficient and densification of the film structure does not proceed sufficiently, etc., while if it exceeds the upper limit value, inconveniences occur that hydrolysis proceeds too excessively so that precipitation occurs, or crack is likely generated at the film. Among these, the ratio of water is preferably set to 0.8 to 2 mol based on 1 mol of the above-mentioned PZT precursor. Further, when a linear monoalcohol is contained in the above-mentioned composition, a gel film which can effectively release an organic material at the time of calcination can be formed, and even when the film thickness exceeds 100 nm, a PZT film (the thickness adjusting film 12b) which is dense and has high characteristics can be obtained. The linear monoalcohol may be mentioned 1-heptanol (carbon chain: 7), 1-octanol (carbon chain: 8), 1-nonanol (carbon chain: 9), etc.

Incidentally, other than the above-mentioned components, β-diketones (for example, acetylacetone) may be added as a stabilizer depending on necessity. In addition, a polar solvent such as a formamide type solvent, etc., may be added to the above-mentioned composition as an organic dopant. As the formamide type solvent, either of formamide, N-methylformamide or N,N-dimethylformamide is preferably used. In the composition of the present invention, since the PZT precursor is hydrolyzed, so that a film with less cracks and a thick film can be formed without adding the above-mentioned formamide type solvent, etc. On the other hand, by using these materials in combination, the thickness adjusting film 12b having less cracks and a dense film structure can be formed according to the combination with the above-mentioned polyvinylpyrrolidone, etc. Also, a more uniform coating film can be formed when the composition is to be coated, and further, an effect of making an escape of the solvent good at the time of baking can be heightened.

Subsequently, a method for adjusting the above-mentioned composition for forming the thickness adjusting film is explained. First, PZT precursors of the above-mentioned Pb compound, etc., are each prepared, and these are weighed so that these become a ratio which provides the above-mentioned desired metal atomic ratio. The above-mentioned PZT precursor, the diol and water each weighed are charged into a reaction vessel and mixed, preferably refluxed under nitrogen atmosphere at a temperature of 130 to 175° C. for 0.5 to 3 hours and reacted to prepare a synthetic liquid. After the reflux, the solvent is preferably removed by the method of an atmospheric pressure distillation or a reduced pressure distillation. When a stabilizer such as acetylacetone, etc., is to be added, it is preferred that these are added to the synthetic liquid after removing the solvent, and then, the mixture is subjected to reflux under nitrogen atmosphere at a temperature of 130 to 175° C. for 0.5 to 5 hours. Thereafter, the synthetic liquid is cooled by allowing to stand under room temperature, whereby it is cooled to room temperature (about 25° C.)

A linear monoalcohol is added to the synthetic liquid after cooling to prepare a sol-gel solution. At this time, a concentration of the PZT precursor occupied in 100% by mass of the composition is so adjusted that it becomes an oxide concentration of 17 to 35% by mass and a ratio of the diol is 16 to 56% by mass. It is also preferred to add a solvent other than the diol to the above-mentioned sol-gel solution. Next, the above-mentioned sol-gel solution is refluxed again under a predetermined atmosphere, for example, under a nitrogen atmosphere, at a temperature of 100 to 175° C. for 0.5 to 10 hours. When an organic dopant including a polar solvent such as the formamide type solvent, etc., is to be added, it is preferably added thereto with the solvent (an alcohol, etc.) other than the diol.

Then, the polyvinylpyrrolidone or the polyethylene glycol is added with an amount of 0.01 to 0.25 mol in terms of a monomer based on 1 mol of the PZT precursor, and stirred to uniformly disperse it therein. According to this procedure, the composition for forming the thickness adjusting film can be obtained.

Incidentally, after preparation of the above-mentioned composition, it is preferred that the particles are removed by a filtration treatment, etc., to make the number of the particles having a particle diameter of 0.5 μm or more (in particular, 0.3 μm or more, above all, 0.2 μm or more) 50 particles or less per 1 ml of the composition. If the number of the particles having a particle diameter of 0.5 μm or more in the composition exceeds 50 particles per 1 ml of the composition, long term storage stability is inferior. The number of the particles having a particle diameter of 0.5 μm or more in the composition is preferably as little as possible, in particular, it is preferably 30 particles or less per 1 ml of the composition.

A method of processing the composition after adjusting the number of the particle in the above-mentioned range is not particularly limited and may be mentioned, for example, the following methods. The first method is a filtration method in which the composition is fed under pressure by a syringe using a commercially available membrane filter having a pore size of 0.2 μm. The second method is a filtration method under pressure in which a commercially available membrane filter having a pore size of 0.05 μm and a pressure tank are used in combination. The third method is a circulatory filtration method in which the filter used in the above-mentioned second method and a solution circulating tank are used in combination.

In either of the methods, a particle capturing rate by the filter varies depending on the pressure at the time of feeding the composition. It has generally been known that as a pressure is low, a capturing rate becomes high so that, in particular, in the first method or the second method, it is preferred that the composition is passed through the filter extremely slowly with a low pressure to realize the conditions that the number of the particles having a particle diameter of 0.5 μm or more is made 50 particles or less.

Next, a preparation method of a thickness adjusting film 12b by drying, calcination and baking a coated film using the above-mentioned composition for forming the thickness adjusting film is explained. More specifically, after forming a coating film on the orientation control film 12a, the coating film is subjected to drying, calcination, and further baking to crystalize. The calcination is carried out by using a hot plate or a rapid thermal annealing (RTA), etc., under the predetermined conditions. The calcination is carried out to remove the solvent as well as to convert the metallic compound to a composite oxide by thermal decomposition or hydrolysis, so that it is desirably carried out in the air, in an oxidative atmosphere or in a vapor-containing atmosphere. Even in the heating in the air, moisture necessary for hydrolysis can be ensured sufficiently by the humidity in the air. Incidentally, before the calcination, a low temperature heating may be carried out by using a hot plate, etc., at a temperature of 70 to 90° C. for 0.5 to 5 minutes to remove, in particular, a low boiling point solvent or an adsorbed water molecule.

The calcination is preferably carried out by a two-step calcination in which a temperature raising rate and a heating and holding temperature have been changed by the reasons that the solvent, etc., are sufficiently removed and an effect of suppressing voids or cracks is more heightened, or densification of the film structure is to be proceeded. When the two-step calcination is carried out, the first step is a calcination holding at 250 to 300° C. for 3 to 10 minutes, and the second step is a calcination holding at 400 to 500° C. for 3 to 10 minutes. In addition, it is more preferred that the temperature raising rate from the room temperature to the first step calcination temperature is made relatively slow as 2.5 to 5° C./sec, and the temperature raising rate from the first step calcination temperature to the second step calcination temperature is made relatively rapid as 30 to 100° C./sec.

Here, the reason why the first step calcination temperature is limited into the range of 250 to 300° C. is that if it is less than the lower limit value, thermal decomposition of the precursor substance is insufficient and cracks are likely generated, while if it exceeds the upper limit value, the precursor substance at the upper portion of the substrate is firstly decomposed before the precursor substance in the vicinity of the substrate is decomposed, and the organic material remains in the film near to the substrate whereby voids are likely generated. The reason why the first step calcination time is limited into the range of 3 to 10 minutes is that if it is less than the lower limit value, decomposition of the precursor substance does not proceed sufficiently, while if it exceeds the upper limit value, a process time becomes long whereby the productivity is lowered. The reason why the second step calcination temperature is limited into the range of 400 to 450° C. is that if it is less than the lower limit value, a residual organic material remained in the precursor substance cannot completely be removed so that densification of the film does not proceed sufficiently, while if it exceeds the upper limit value, crystallization proceeds whereby orientation can be difficulty controlled. Further, the reason why the second step calcination time is limited into the range of 3 to 10 minutes is that if it is less than the lower limit value, a residual organic material cannot sufficiently be removed so that a strong stress occurs at the time of crystallization, whereby peeling or cracks of the film is/are likely generated, while if it exceeds the upper limit value, a process time becomes long whereby the productivity is lowered.

Incidentally, in the composition to be used in the forming method, an added amount of the polyvinylpyrrolidone, etc., is a little and the organic material forms a gel which can be easily removed as mentioned above, so that even when a relatively thick coating film is to be calcinated, it can be carried out by a single-step calcination whereby production efficiency can be improved. A temperature at the time of carrying out the calcination by a single-step calcination is preferably at 400 to 500° C., and a holding time at the temperature is preferably 1 to 5 minutes. In addition, the composition to be used has a high suppressing effect of cracks in spite of little amount of the polyvinylpyrrolidone, etc. Therefore, even when a relatively thick coating film is to be calcinated, the temperature raising rate is not so necessarily lowered so that production efficiency is high. The temperature raising rate from during the room temperature and 200° C. to the calcination temperature is preferably set to 10 to 100° C./sec. By using the above-mentioned composition, a thick film of about several hundred nm can be formed by the coating of once.

The baking is a process for crystallizing the coating film after the calcination by baking at a temperature of a crystallization temperature or higher, whereby a silicon substrate 10 on which the ferroelectric film 12 having the orientation control film 12a and the thickness adjusting film 12b had been formed can be obtained. A baking atmosphere at the crystallization process is suitably $O_2$, $N_2$, Ar, $N_2O$ or $H_2$, etc., or a mixed gas thereof. The baking is carried out at 600 to 700° C. for about 1 to 5 minutes. The baking may be carried out by the rapid thermal annealing (RTA). When the baking is carried out by the RTA treatment, the temperature raising rate is preferably set to 2.5 to 100° C./sec. Coating, drying, calcination and baking of the above-mentioned composition are repeated until the ferroelectric film 12 becomes a desired thickness.

In the thus obtained ferroelectric film-attached silicon substrate 10, the residual stress in the ferroelectric film 12 on the substrate body 11 is 14 MPa to 31 MPa in the absolute value, and the ferroelectric film is crystal oriented in the (100) plane, so that warpage generating at the silicon substrate 10 can be suppressed. In addition, by reducing the residual stress generating in the ferroelectric film 12, warpage generating at the silicon substrate 10 can be suppressed, so that the ferroelectric film 12 can be formed with a thick film, and it can prevent from occurrence of inconvenience that accurate patterning of an electrode, etc., can be hardly carried out in the post-process of the silicon substrate 10 on which the ferroelectric film 12 has been formed. Further, when the ferroelectric film 12 with the same thickness is formed on the substrate body 11, even when the ferroelectric films 12 are formed on the thin substrate body 11, warpage is substantially not generated at the silicon substrate 10.

Second Embodiment

Figure 2:
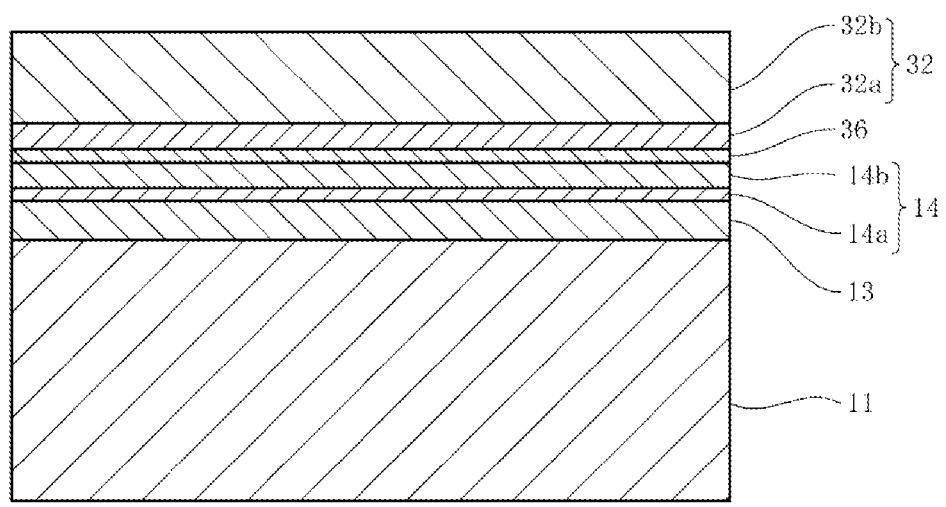
FIG. 2 is a cross-section constituting drawing showing the second embodiment of the present invention and the ferroelectric film-attached silicon substrate of Example 5.

FIG. 2 shows the second embodiment of the present invention. In FIG. 2, the same reference numerals as in FIG. 1 show the same parts of the same. In this embodiment, for controlling an average particle diameter of the crystal particles of the ferroelectric film 32 in the small range of 100 to 150 nm among 100 to 1,000 nm, a crystal particle diameter control film 36 is formed on a Pt film 14b of a lower electrode 14 before forming an orientation control film 32a, and the orientation control film 32a is then formed on the crystal particle diameter control film 36. A thickness adjusting film 32b is then formed on the orientation control film 32a. By providing the crystal particle diameter control film 36 as mentioned above, a generating density of the nuclei can be heightened, so that abnormal particle growth of the crystals of the orientation control film 32a can be suppressed, and as a result, the orientation control film 32a having a fine crystal structure and preferentially crystal oriented in the (100) plane can be obtained. The orientation control film 32a formed on the crystal particle diameter control film 36 also has a fine crystal structure and becomes a film preferentially crystal oriented in the (100) plane. A thickness of the crystal particle diameter control film 36 is preferably 1 nm to 10 nm. The reason why the thickness of the crystal particle diameter control film 36 is limited into the range of 1 nm to 10 nm is that if it exceeds 10 nm, an improved effect in the generating density of the nuclei cannot be obtained, and as a result, a fine crystal structure cannot be obtained.

On the other hand, as a sol-gel solution for controlling crystal particle diameter for forming the above-mentioned crystal particle diameter control film 36, it may preferably use a commercially available sol-gel solution obtained by mixing lead titanate, lead zirconate titanate, lead zirconate, etc., with a solvent such as butanol, ethanol, 2-methoxyethanol, etc. A concentration of lead titanate, etc., occupied in 100% by mass of the above-mentioned sol-gel solution for controlling crystal particle diameter is 1 to 3% by mass in terms of an oxide concentration. Here, the oxide concentration in the concentration of the PZT precursor occupied in the sol-gel solution for controlling crystal particle diameter means a concentration of a metal oxide occupied in 100% by mass of the sol-gel solution for controlling crystal particle calculated by assuming that all the metal elements contained in the sol-gel solution for controlling crystal particle had been changed to the objective oxides. In addition, the reason why lead titanate, etc., occupied in 100% by mass of the sol-gel solution for controlling crystal particle diameter is limited into the range of 1 to 3% by mass in terms of an oxide concentration is that if it is less than 1% by mass, a nuclei generation site cannot be formed with a sufficient amount, while if it exceeds 3% by mass, it becomes a film having a sufficient thickness whereby a nuclei generating density cannot be controlled.

Next, a method for forming a crystal particle diameter control film 36 using the above-mentioned sol-gel solution for controlling crystal particle diameter, and further forming an orientation control film 32a and a thickness adjusting film 32b on the crystal particle diameter control film 36 in this order is explained. First, the sol-gel solution for controlling crystal particle diameter is coated on a Pt film 14b of the lower electrode 14 by using the coating method such as spin coating, dip coating, LSMCD method, etc., to form a coating film (a gel film) having a desired thickness. Then, the coating film on the Pt film 14b is subjected to drying and calcination by holding in an air atmosphere at 150 to 550° C. for 1 to 10 minutes. Here, the reason why the drying and calcination temperature is limited into the range of 150 to 550° C. is that if it is lower than 150° C., decomposition of the PZT precursor does not proceed sufficiently, while if it exceeds 550° C., crystallization proceeds too excessively whereby it is difficult to control the nuclei generating density. Then, the same sol-gel solution for controlling orientation as the sol-gel solution for controlling orientation of the first embodiment is coated on the calcinated material of the crystal particle diameter control film 36 by using the coating method such as spin coating, dip coating, LSMCD method, etc., to form a coating film (a gel film) having a desired thickness. Then, the coating film on the calcinated material of the crystal particle diameter control film 36 is subjected to drying and calcination by holding it in an air atmosphere at 175 to 315° C. for 1 to 10 minutes. Here, the reason why the drying and calcination temperature is limited into the range of 175 to 315° C. is that initial nuclei crystal oriented in the (100) plane are formed within the range of 175 to 315° C. by introducing the crystal particle diameter control film 36 having a low crystallization temperature. Next, the calcinated material of the above-mentioned crystal particle diameter control film 36 and the calcinated material of the orientation control film 32a are crystallized by subjecting to baking by holding them in an air atmosphere at 450 to 800° C. for 1 to 60 minutes, whereby the crystal particle diameter control film 36 and the orientation control film 32a are formed on the Pt film 14b of the lower electrode 14 in this order. Further, a thickness adjusting film 32b is formed on the orientation control film 32a in the same manner as in the first embodiment. According to the procedure as mentioned above, a silicon substrate 30 having the ferroelectric film 32 which comprises the orientation control film 32a and the thickness adjusting film 32b on the crystal particle diameter control film 36 which is formed on the Pt film 14b can be obtained.

In the thus obtained ferroelectric film-attached silicon substrate 30, it is the same as in the first embodiment except that the crystal particle diameters of the orientation control film 32a and the thickness adjusting film 32b are controlled into the narrow range of 100 to 150 nm, so that the same explanation is not repeated again.

EXAMPLES

Next, Examples of the present invention are explained in detail with Comparative Examples.

Example 1

(a) Formation Method of Orientation Control Film of Ferroelectric Film

As shown in FIG. 1, a $SiO_2$ film 13 was firstly formed on a substrate body 11 made of silicon and having a diameter of 4 inches, and a lower electrode 14 comprising a $TiO_X$ film 14a and a Pt film 14b was formed on the $SiO_2$ film 13. Here, a thickness of the substrate body 11 was 500 μm, a thickness of the $SiO_2$ film 13 was 500 nm, a thickness of the $TiO_X$ film 14a was 30 nm, and a thickness of the Pt film 14b was 200 nm. Then, the substrate body 11 onto which the $SiO_2$ film 13 and the lower electrode 14 have been formed was set onto a spin coater, and while rotating the substrate body 11 with a rotation speed of 3,000 rpm, a sol-gel solution (the sol-gel solution for controlling orientation) available from Mitsubishi Materials Corporation was dropped onto the Pt film 14b for 15 seconds to form a coating film (a gel film) on the Pt film 14b. Here, a PZT precursor was contained in the sol-gel solution for controlling orientation, and a contained ratio of lead, titanium and zirconium in the sol-gel solution for controlling orientation was 115:53:47 with a metal atomic ratio. In addition, the solvent of the sol-gel solution for controlling orientation was butanol. Further, a concentration of the PZT precursor occupied in 100% by mass of the above-mentioned sol-gel solution for controlling orientation was 12% by mass with an oxide concentration. Next, the substrate body 11 onto which a coating film has been formed on the Pt film 14b of the lower electrode 14 was dried and calcined by holding at a temperature of 300° C. for 5 minutes on a hot plate, then, baked in an oxygen atmosphere at 700° C. for 1 minute by the rapid thermal annealing (RTA). A temperature raising rate at this time was 10° C./sec. According to the above procedure, an orientation control film 12a having an average particle diameter of crystal particles of 700 nm, the crystals of which have been oriented in a (100) plane and having a thickness of 60 nm was obtained.

(b) Formation Method of Thickness Adjusting Film of Ferroelectric Film

First, lead acetate trihydrate (Pb source), titanium tetraisopropoxide (Ti source) and zirconium tetrabutoxide (Zr source) were each weighed as a PZT precursor so that the contained ratio of lead, titanium and zirconium became 115:53:47 with a metal atomic ratio, and these were added to a mixed solution comprising propylene glycol (diol), acetylacetone and ultrapure water (water) in a reaction vessel and reacted to prepare a synthetic liquid. Here, ultrapure water (water) was so added to the PZT precursor that it became 2 mol based on 1 mol thereof. The synthetic liquid was refluxed at a temperature of 150° C. under nitrogen atmosphere for one hour, then, distillation under reduced pressure was carried out so that a concentration of the PZT precursor occupied in 100% by mass of the above-mentioned synthetic liquid became 35% in terms of an oxide concentration to remove the unnecessary solvent.

Then, the synthetic liquid was cooled by allowing to stand at room temperature whereby it was cooled to 25° C., then, 1-octanol (a linear monoalcohol with a carbon chain of 8), ethanol (solvent) and N-methylformamide (a polar solvent) were added thereto to obtain a sol-gel solution in which a concentration of the PZT precursor occupied in 100% by mass of the sol-gel solution is 25% by mass in terms of an oxide concentration.

Next, to the above-mentioned sol-gel solution was added polyvinylpyrrolidone (k value=30) so that it became 0.025 mol based on 1 mol of the PZT precursor, and the mixture was stirred at room temperature (25° C.) for 24 hours to obtain a composition for forming a thickness adjusting film. This composition had a number of the particles having a particle diameter of 0.5 μm or more of 3 per 1 ml of the respective solutions by feeding under pressure with a syringe and filtering using a commercially available membrane filter having a pore size of 0.05 μm. Also, a concentration of the PZT precursor occupied in 100% by mass of the composition was 25% by mass in terms of an oxide concentration. Further, 1-octanol (a linear monoalcohol having a carbon chain of 8) was contained in an amount of 6.3% by mass based on 100% by mass of the above-mentioned composition. Moreover, propylene glycol (diol) was contained in an amount of 36% by mass based on 100% by mass of the above-mentioned composition. Here, the concentration of the PZT precursor in terms of an oxide concentration occupied in the above-mentioned synthetic liquid, the above-mentioned sol-gel solution or the above-mentioned composition means a concentration of a metal oxide occupied in 100% by mass of the synthetic liquid, the sol-gel solution or the composition calculated by assuming that all the metal elements contained in the synthetic liquid, the sol-gel solution or the composition had been changed to the objective oxides.

The obtained composition was dropped onto the orientation control film 12a of the above-mentioned substrate body 11 which had been set on a spin coater, and spin coating was carried out with a rotation speed of 1,800 rpm for 60 seconds to form a coating film (a gel film) on the above-mentioned orientation control film 12a. With regard to the coating film on the orientation control film 12a, a two-step calcination and baking were carried out with a temperature profile shown in FIG. 3 to form a thickness adjusting film 12b. More specifically, first, before subjecting to the second-step calcination and baking, the above-mentioned substrate body 11 on which the coating film has been formed was held in an air atmosphere at a temperature of 75° C. for 1 minute by using a hot plate to remove a low boiling point solvent or an adsorbed water molecule.

Figure 3:
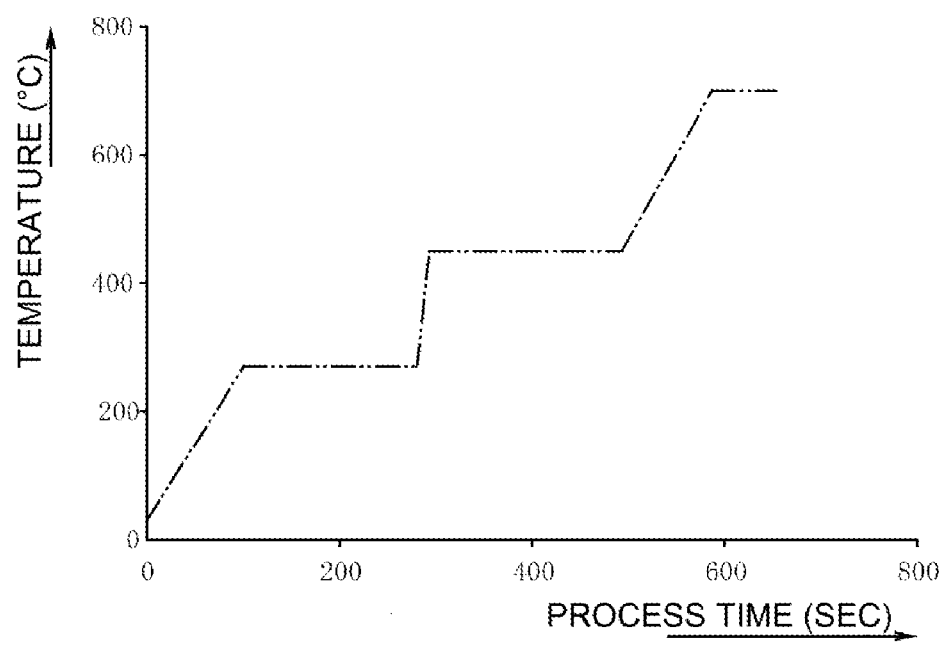
FIG. 3 is a graph showing one example of a temperature profile in a high temperature process for forming the thickness adjusting film of Examples.

Then, the gel film was thermally decomposed by subjecting to a first step calcination by holding it at 300° C. for 10 minutes using a hot plate. Next, minor residual organic materials in the film was completely removed by holding at 450° C. for 10 minutes on a hot plate. The same operation was repeated once again to obtain a calcination film (PZT amorphous film) having 400 nm. Further, baking was carried out in an oxygen atmosphere by raising the temperature from a room temperature to 700° C. with a temperature raising rate of 10° C./sec as shown in FIG. 3, and holding at 700° C. for 1 minute. Coating, drying, calcination and baking of the above-mentioned composition were further repeated twice, i.e., coating, drying, calcination and baking of the above-mentioned composition were carried out three times in total, whereby a thickness adjusting film 12b having a thickness of 1,200 nm was formed on the above-mentioned orientation control film 12a. According to the above procedure, a silicon substrate 10 having a ferroelectric film 12 which has a total thickness of 1,260 nm and comprises the orientation control film 12a having a thickness of 60 nm and the thickness adjusting film 12b having a thickness of 1,200 nm was obtained. This ferroelectric film-attached silicon substrate 10 was made Example 1. Incidentally, the thickness adjusting film 12b had an average particle diameter of the crystal particles of 700 nm and crystal oriented in the (100) plane.

Example 2

A silicon substrate having a ferroelectric film which has a total thickness of 1,260 nm and comprises an orientation control film having a thickness of 60 nm and a thickness adjusting film having a thickness of 1,200 nm was prepared in the same manner as in Example 1 except for using a substrate body having a diameter of 6 inches. This ferroelectric film-attached silicon substrate was made Example 2. Incidentally, the orientation control film and the thickness adjusting film each had an average particle diameter of the crystal particles of 700 nm and crystal oriented in the (100) plane.

Example 3

A silicon substrate having a ferroelectric film which has a total thickness of 1,260 nm and comprises an orientation control film having a thickness of 60 nm and a thickness adjusting film having a thickness of 1,200 nm was prepared in the same manner as in Example 1 except for using a substrate body having a diameter of 8 inches. This ferroelectric film-attached silicon substrate was made Example 3. Incidentally, the orientation control film and the thickness adjusting film each had an average particle diameter of the crystal particles of 700 nm and crystal oriented in the (100) plane.

Example 4

A silicon substrate having a ferroelectric film with a total thickness of 860 nm which comprises an orientation control film having a thickness of 60 nm and a thickness adjusting film having a thickness of 800 nm was prepared in the same manner as in Example 1 except that the thickness adjusting film having a thickness of 800 nm had been formed on the orientation control film by subjecting coating, drying, calcination and baking of the composition twice in total in the formation process of the thickness adjusting film. This ferroelectric film-attached silicon substrate was made Example 4. Incidentally, the orientation control film and the thickness adjusting film each had an average particle diameter of the crystal particles of 700 nm and crystal oriented in the (100) plane.

Example 5

Before forming an orientation control film on a Pt film, a crystal particle diameter control film was formed on the Pt film, an orientation control film was formed on the crystal particle diameter control film, and further a thickness adjusting film was formed on the orientation control film. More specifically, a ferroelectric film-attached silicon substrate was prepared as mentioned below.

(a) Formation Method of Crystal Particle Diameter Control Film

As shown in FIG. 2, first, a $SiO_2$ film 13 was formed on a substrate body 11 made of silicon having a diameter of 4 inches, and a lower electrode 14 comprising a $TiO_X$ film 14a and a Pt film 14b was formed on the $SiO_2$ film 13. Here, a thickness of the substrate body 11 was 500 μm, a thickness of the $SiO_2$ film 13 was 500 nm, a thickness of the $TiO_X$ film 14a was 30 nm, and a thickness of the Pt film 14b was 200 nm. The substrate body 11 on which the $SiO_2$ film 13 and the lower electrode 14 had been formed was set onto a spin coater, and while rotating the substrate body 11 with a rotation speed of 3,000 rpm, a sol-gel solution (a sol-gel solution for controlling crystal particle diameter) available from Mitsubishi Materials Corporation was dropped onto the Pt film 14b for 15 seconds to form a coating film (a gel film) on the Pt film 14b. Here, in the sol-gel solution for controlling crystal particle diameter, the PT precursor is contained, and a contained ratio of lead and titanium in the sol-gel solution for controlling crystal particle was 125:100 with a metal atomic ratio. Also, the solvent of the sol-gel solution for controlling crystal particle diameter was butanol. Further, a concentration of the PT precursor occupied in 100% by mass of the above-mentioned sol-gel solution for controlling crystal particle diameter was 1% by mass in terms of an oxide concentration. Next, the substrate body 11 on which the coating film has been formed on the Pt film 14b of the lower electrode 14 was subjected to drying and calcination by holding it on a hot plate at a temperature of 300° C. for 5 minutes. According to the above procedure, a calcinated material of the crystal particle diameter control film 36 was manufactured on the Pt film 14b.

(b) Formation Method of Orientation Control Film of Ferroelectric Film

The substrate body 11 on which the $SiO_2$ film 13, the lower electrode 14, and the calcinated material of the crystal particle diameter control film 36 had been formed was set onto a spin coater, and a sol-gel solution (the sol-gel solution for controlling orientation) available from Mitsubishi Materials Corporation was dropped onto the calcinated material of the crystal particle diameter control film 36 for 15 seconds while rotating the substrate body 11 with a rotation speed of 3,000 rpm to form a coating film (a gel film) on the calcinated material of the crystal particle diameter control film 36. Here, as the above-mentioned sol-gel solution for controlling orientation, the same sol-gel solution for controlling orientation as in Example 1 was used, and drying, calcination and baking were carried out in the same manner as in Example 1. According to the above procedure, the crystal particle diameter control film 36 and the orientation control film 32*a* were formed on the Pt film 14*b* in this order. The crystal particles of the orientation control film 32*a* had an average particle diameter of 100 nm and crystal oriented in the (100) plane. Also, a thickness of the orientation control film 32*a* was 60 nm.

(c) Formation Method of Thickness Adjusting Film of Ferroelectric Film

First, a composition for forming the thickness adjusting film was prepared in the same manner as in Example 1. Next, a thickness adjusting film was formed on the orientation control film in the same manner as in Example 1. According to the above procedure, a silicon substrate 30 having the ferroelectric film 32 with a total thickness of 1,260 nm which comprises the orientation control film 32*a* having a thickness of 60 nm and the thickness adjusting film 32*b* having a thickness of 1,200 nm was obtained. This ferroelectric film-attached silicon substrate 30 was made Example 5. Incidentally, the thickness adjusting film 32*b* had an average particle diameter of the crystal particles of 100 nm and crystal oriented in the (100) plane.

Example 6

In the formation process of the thickness adjusting film, the composition for adjusting thickness of Example 1 was subjected to coating, drying, calcination and baking to form a thickness adjusting film having a thickness of 300 nm on the orientation control film, and the coating, drying, calcination and baking of the composition were repeated five times, i.e., the coating, drying, calcination and baking of the composition were carried out six times in total, a thickness adjusting film having a thickness of 1,800 nm was formed on the orientation control film. A silicon substrate having the ferroelectric film with a total thickness of 1,860 nm which comprises the orientation control film having a thickness of 60 nm and the thickness adjusting film having a thickness of 1,800 nm was prepared in the same manner as in Example 1 except for the above-mentioned point. This ferroelectric film-attached silicon substrate was made Example 6. Incidentally, the orientation control film and the thickness adjusting film each had an average particle diameter of the crystal particles of 700 nm and crystal oriented in the (100) plane.

Example 7

A silicon substrate having the ferroelectric film with a total thickness of 2,860 nm which comprises the orientation control film having a thickness of 60 nm and the thickness adjusting film having a thickness of 2,800 nm was prepared in the same manner as in Example 1 except that coating, drying, calcination and baking of the composition were carried out seven times in total to form a thickness adjusting film having a thickness of 2,800 nm on the orientation control film in the formation process of the thickness adjusting film. This ferroelectric film-attached silicon substrate was made Example 7. Incidentally, the orientation control film and the thickness adjusting film each had an average particle diameter of the crystal particles of 700 nm and crystal oriented in the (100) plane.

Example 8

A silicon substrate having the ferroelectric film with a total thickness of 4,860 nm which comprises the orientation control film having a thickness of 60 nm and the thickness adjusting film having a thickness of 4,800 nm was prepared in the same manner as in Example 1 except that coating, drying, calcination and baking of the composition were carried out twelve times in total to form a thickness adjusting film having a thickness of 4,800 nm on the orientation control film in the formation process of the thickness adjusting film. This ferroelectric film-attached silicon substrate was made Example 8. Incidentally, the orientation control film and the thickness adjusting film each had an average particle diameter of the crystal particles of 700 nm and crystal oriented in the (100) plane.

Example 9

A silicon substrate having the ferroelectric film with a total thickness of 10,060 nm which comprises the orientation control film having a thickness of 60 nm and the thickness adjusting film having a thickness of 10,000 nm was prepared in the same manner as in Example 1 except that coating, drying, calcination and baking of the composition were carried out twenty five times in total to form a thickness adjusting film having a thickness of 10,000 nm on the orientation control film in the formation process of the thickness adjusting film. This ferroelectric film-attached silicon substrate was made Example 9. Incidentally, the orientation control film and the thickness adjusting film each had an average particle diameter of the crystal particles of 700 nm and crystal oriented in the (100) plane.

Example 10

A silicon substrate having the ferroelectric film with a total thickness of 1,260 nm which comprises the orientation control film having a thickness of 60 nm and the thickness adjusting film having a thickness of 1,200 nm was prepared in the same manner as in Example 1 except that the crystal particle diameter control film was not introduced in the formation process of the orientation control film. This ferroelectric film-attached silicon substrate was made Example 10. Incidentally, the orientation control film and the thickness adjusting film each had an average particle diameter of the crystal particles of 1,000 nm and crystal oriented in the (100) plane.

Comparative Example 1

An orientation control film was formed on the Pt film in the same manner as in Example 1 except that the substrate body in which a coating film had been formed on the Pt film was held at a temperature of 450° C. for 5 minutes on a hot plate in the formation process of the orientation control film. According to the above procedure, the orientation control film having a thickness of 60 nm and an average particle diameter of the crystal particles of 100 nm, and crystal oriented in the (111) plane was obtained. Next, in the formation process of the thickness adjusting film, a thickness adjusting film was formed on the above-mentioned orientation control film crystal oriented in the (111) plane in the same manner as in Example 1. According to the above procedure, a silicon substrate having the ferroelectric film with a total thickness of 1,260 nm which comprises the orientation control film having a thickness of 60 nm and the thickness adjusting film having a thickness of 1,200 nm was obtained. This ferroelectric film-attached silicon substrate was made Comparative Example 1. Incidentally, the orientation control film and the thickness adjusting film each had an average particle diameter of the crystal particles of 100 nm and crystal oriented in the (111) plane.

Comparative Example 2

First, in the formation process of the crystal particle diameter control film, a calcinated material of the crystal particle diameter control film was formed on the Pt film in the same manner as in Example 5. Then, in the formation process of the orientation control film, a crystal particle control film and an orientation control film were formed on the Pt film in this order in the same manner as in Example 5. According to the above procedure, the orientation control film having a thickness of 60 nm and an average particle diameter of the crystal particles of 100 nm, and crystal oriented in the (100) plane was obtained.

Next, in the formation process of the thickness adjusting film, a substrate body on which the SiO$_2$ film, the lower electrode, the crystal particle diameter control film and the orientation control film had been formed was set onto a spin coater, a sol-gel solution (a sol-gel solution for adjusting thickness) available from Mitsubishi Materials Corporation was dropped onto the orientation control film for 15 seconds while rotating the substrate body with a rotation speed of 3,000 rpm to form a coating film (a gel film) on the orientation control film. Here, a PZT precursor was contained in the sol-gel solution for adjusting thickness, and a contained ratio of lead, titanium and zirconium of the sol-gel solution for adjusting thickness was 112:52:48 in terms of a metal atomic ratio. In addition, the solvent of the sol-gel solution for adjusting thickness was butanol. Further, a concentration of the PZT precursor occupied in 100% by mass of the above-mentioned sol-gel solution for adjusting thickness was 15% by mass in terms of an oxide concentration. Next, the substrate body in which a coating film had been formed on the orientation control film was held on a hot plate at a temperature of 300° C. for 5 minutes to subject to drying and calcination to obtain a calcination film. Coating, drying and calcination of the sol-gel solution for adjusting thickness were further repeated twice, i.e., the coating, drying and calcination of the above-mentioned sol-gel solution for adjusting thickness were repeated three times in total, and then, baked by holding it in an oxygen atmosphere at 700° C. for 1 minute by the rapid thermal annealing (RTA). A temperature raising rate at this time was 10° C./sec. Further, an operation of coating, drying and calcination of the above-mentioned sol-gel solution for adjusting thickness were repeated three times in total, and then, baking was carried out was repeated three times, i.e., an operation of the coating, drying and calcination of the above-mentioned sol-gel solution for adjusting thickness were repeated three times in total, and then, baking was carried out was repeated four times in total, to form the thickness adjusting film having a thickness of 980 nm on the orientation control film. According to the above procedure, a silicon substrate having the ferroelectric film with a total thickness of 1,040 nm comprising the orientation control film having a thickness of 60 nm and the thickness adjusting film having a thickness of 980 nm was obtained. This ferroelectric film-attached silicon substrate was made Comparative Example 2. Incidentally, the thickness adjusting film had an average particle diameter of the crystal particles of 100 nm and crystal oriented in the (100) plane.

Comparative Example 3

First, in the formation process of the orientation control film, an orientation control film was formed on the Pt film in the same manner as in Example 1. This orientation control film has an average particle diameter of the crystal particles of 700 nm and crystal oriented in the (100) plane. Then, in the formation process of the orientation control film, the crystal particle control film and the orientation control film were formed on the Pt film in this order in the same manner as in Example 5. According to the above procedure, the orientation control film having a thickness of 60 nm and an average particle diameter of the crystal particles of 700 nm, and crystal oriented in the (100) plane was obtained. Next, in the formation process of the thickness adjusting film, a thickness adjusting film was formed on the orientation control film in the same manner as in Comparative Example 2. According to the above procedure, a silicon substrate having the ferroelectric film with a total thickness of 1,040 nm which comprises the orientation control film having a thickness of 60 nm and the thickness adjusting film having a thickness of 980 nm was obtained. This ferroelectric film-attached silicon substrate was made Comparative Example 3. Incidentally, the thickness adjusting film had an average particle diameter of the crystal particles of 700 nm and crystal oriented in the (100) plane.

Comparative Example 4

First, in the formation process of the orientation control film, an orientation control film was formed on the Pt film in the same manner as in Comparative Example 1. This orientation control film has an average particle diameter of the crystal particles of 100 nm and crystal oriented in the (111) plane. Next, in the formation process of the thickness adjusting film, a thickness adjusting film was formed on the orientation control film in the same manner as in Comparative Example 2. According to the above procedure, a silicon substrate having the ferroelectric film with a total thickness of 1,040 nm which comprises the orientation control film having a thickness of 60 nm and the thickness adjusting film having a thickness of 980 nm was obtained. This ferroelectric film-attached silicon substrate was made Comparative Example 4. Incidentally, the thickness adjusting film had an average particle diameter of the crystal particles of 100 nm and crystal oriented in the (111) plane.

<Comparative Test 1 and Evaluation>

With regard to the ferroelectric film-attached silicon substrates of Examples 1 to 10 and Comparative Examples 1 to 4, residual stresses of the ferroelectric films and warpage amounts of the silicon substrates were each measured. The residual stress of the ferroelectric film was obtained by measuring curvature radius of the silicon substrate using a thin film stress measurement system (FLX-2320-S manufactured by Toho Technology Inc.), and calculating the residual stress of the ferroelectric film based on the curvature radius. Here, for calculating the residual stress σ of the ferroelectric film, the Stoney's formula represented by the following formula (1) was used.

$$\sigma = E t_s^2 [(1/R) - (1/R_0)] / [6 t_c (1-\gamma)] \quad (1)$$

In the above-mentioned formula (1), E is a Young's modulus of the silicon substrate, and $t_s$ is a thickness of the silicon substrate. In addition, in the formula (1), $R_0$ is a curvature radius of the silicon substrate before forming the ferroelectric film, and R is a curvature radius of the silicon substrate after forming the ferroelectric film. Further, in the formula (1), $t_c$ is a thickness of the ferroelectric film, and γ is a Poisson ratio of the silicon substrate. Provided that, to remove the effect of warpage of the silicon substrate accompanied by thermal deformation of the lower electrode, as $R_0$, curvature radius of the silicon substrate after removing the whole ferroelectric film was used by subjecting the silicon substrate after the film formation to etching by using ADEKACHELUMICA WPZ-2029 (available from ADEKA Corporation), and the residual stress σ of the ferroelectric film was calculated. The results are shown in Table 1. Incidentally, at the column of the solution for forming the thickness adjusting film of Table 1, Solution A means a composition for forming the thickness adjusting film of Examples 1 to 10 and Comparative Example 1, and Solution B is a sol-gel solution used for forming the thickness adjusting film of Comparative Examples 2 to 3.

adjusting film having a thickness of 1,200 nm was prepared in the same manner as in Example 1, except that the contained ratio of lead, titanium and zirconium in the sol-gel solution for controlling orientation was made 115:52:48 in a metal atomic ratio and propylene glycol (diol) was added in an amount of 16% by mass based on 100% by mass of the composition for forming the thickness adjusting film. This ferroelectric film-attached silicon substrate was made Example 11. Incidentally, the orientation control film and the thickness adjusting film had an average particle diameter of the crystal particles of 700 nm and crystal oriented in the (100) plane.

TABLE 1

| | Diameter of substrate body (inch) | Solution for forming thickness adjusting film | Ferroelectric film | | | | Silicon substrate | | |
|---|---|---|---|---|---|---|---|---|---|
| | | | Film thickness (nm) | Orientation | Average crystal particle diameter (nm) | Residual stress (MPa) | Warpage amount (μm) | $R_0$ (m) | R (m) |
| Example 1 | 4 | Solution A | 1260 | (100) | 700 | −17 | 1.7 | 31.1 | 29.3 |
| Example 2 | 6 | Solution A | 1260 | (100) | 700 | −18 | 3.8 | 32.2 | 30.1 |
| Example 3 | 8 | Solution A | 1260 | (100) | 700 | −17 | 7.2 | 34.6 | 32.3 |
| Example 4 | 4 | Solution A | 860 | (100) | 700 | −22 | 2.1 | 34.4 | 32.5 |
| Example 5 | 4 | Solution A | 1260 | (100) | 100 | −31 | 1.3 | 34.7 | 31.9 |
| Example 6 | 4 | Solution A | 1860 | (100) | 700 | −15 | 2.5 | 30.6 | 28.3 |
| Example 7 | 4 | Solution A | 2860 | (100) | 700 | −16 | 3.0 | 32.1 | 28.3 |
| Example 8 | 4 | Solution A | 4860 | (100) | 700 | −14 | 5.4 | 32.1 | 26.3 |
| Example 9 | 4 | Solution A | 10060 | (100) | 700 | −14 | 10.6 | 32.1 | 22.6 |
| Example 10 | 4 | Solution A | 1260 | (100) | 1000 | −18 | 1.2 | 32.2 | 30.1 |
| Comparative Example 1 | 4 | Solution A | 1260 | (111) | 100 | −67 | 6.2 | 34.7 | 27.2 |
| Comparative Example 2 | 4 | Solution B | 1040 | (100) | 100 | −51 | 3.7 | 29.8 | 26.0 |
| Comparative Example 3 | 4 | Solution B | 1040 | (100) | 700 | −104 | 8.7 | 26.5 | 20.9 |
| Comparative Example 4 | 4 | Solution B | 1040 | (111) | 100 | −202 | 15.5 | 32.4 | 19.8 |

As can be clearly seen from Table 1, in Comparative Examples 1 to 4, the absolute values of the residual stress of the ferroelectric films were large as 51 to 202 MPa, while in Examples 1 to 10, the absolute values of the residual stress of the ferroelectric films were small as 14 to 31 MPa. Incidentally, in Comparative Example 1, the ferroelectric film was crystal oriented in the (111) plane, so that the residual stress of the ferroelectric film was considered to be large as 67 MPa in the absolute value. Also, in Comparative Examples 2 and 3, Solution B was used as a liquid for forming the thickness adjusting film of the ferroelectric film, so that the residual stress of the ferroelectric film was considered to be large as 51 MPa and 104 MPa in the absolute value. Further, in Comparative Example 3, the ferroelectric film was crystal oriented in the (111) plane, and Solution B was used as a liquid for forming the thickness adjusting film of the ferroelectric film, so that the residual stress of the ferroelectric film was considered to be remarkably large as 202 MPa in the absolute value.

Example 11

A silicon substrate having the ferroelectric film with a total thickness of 1,260 nm which comprises the orientation control film having a thickness of 60 nm and the thickness Example 12

A ferroelectric film-attached silicon substrate was manufactured in the same manner as in Example 11 except that propylene glycol (diol) in Example 11 was contained to be 56% by mass based on 100% by mass of the composition.

Example 13

A ferroelectric film-attached silicon substrate was manufactured in the same manner as in Example 11 except that ultrapure water (water) of Example 11 was added to be 0.5 mol based on 1 mol of the PZT precursor.

Example 14

A ferroelectric film-attached silicon substrate was manufactured in the same manner as in Example 11 except that ultrapure water (water) of Example 11 was added to be 3 mol based on 1 mol of the PZT precursor.

Example 15

A ferroelectric film-attached silicon substrate was manufactured in the same manner as in Example 11 except that polyvinylpyrrolidone (k value=30) of Example 11 was added to be 0.01 mol based on 1 mol of the PZT precursor.

Example 16

A ferroelectric film-attached silicon substrate was manufactured in the same manner as in Example 11 except that polyvinylpyrrolidone (k value=30) of Example 11 was added to be 0.25 mol based on 1 mol of the PZT precursor.

Comparative Example 5

A ferroelectric film-attached silicon substrate was manufactured in the same manner as in Example 11 except that propylene glycol (diol) of Example 11 was contained to be 15% by mass based on 100% by mass of the composition for forming the thickness adjusting film.

Comparative Example 6

A ferroelectric film-attached silicon substrate was manufactured in the same manner as in Example 11 except that propylene glycol (diol) of Example 11 was contained to be 57% by mass based on 100% by mass of the composition for forming the thickness adjusting film.

Comparative Example 7

A ferroelectric film-attached silicon substrate was manufactured in the same manner as in Example 11 except that ultrapure water (water) of Example 11 was added to be 0.4 mol based on 1 mol of the PZT precursor.

Comparative Example 8

A ferroelectric film-attached silicon substrate was manufactured in the same manner as in Example 11 except that ultrapure water (water) of Example 11 was added to be 3.1 mol based on 1 mol of the PZT precursor.

Comparative Example 9

A ferroelectric film-attached silicon substrate was manufactured in the same manner as in Example 11 except that polyvinylpyrrolidone (k value=30) of Example 11 was not added.

Comparative Example 10

A ferroelectric film-attached silicon substrate was manufactured in the same manner as in Example 11 except that polyvinylpyrrolidone (k value=30) of Example 11 was added to be 0.26 mol based on 1 mol of the PZT precursor.

<Comparative Test 2 and Evaluation>

With regard to the ferroelectric film-attached silicon substrates of Examples 11 to 16 and Comparative Examples 5 to 10, a residual stress and a warpage amount of the silicon substrate were each measured in the same manner as in Comparative test 1. The results are shown in Table 2.

TABLE 2

| | Thickness adjusting film | | | Residual stress of ferroelectric film (MPa) | Warpage amount of silicon substrate (μm) |
|---|---|---|---|---|---|
| | Diol (% by mass) | Ultrapure water (mol) | PVP (mol) | | |
| Example 11 | 16 | 2 | 0.025 | −21 | 1.8 |
| Example 12 | 56 | 2 | 0.025 | −18 | 1.7 |
| Example 13 | 36 | 0.5 | 0.025 | −20 | 1.8 |
| Example 14 | 36 | 3 | 0.025 | −15 | 1.5 |
| Example 15 | 36 | 2 | 0.01 | −35 | 3.2 |
| Example 16 | 36 | 2 | 0.25 | −14 | 1.1 |
| Comparative Example 5 | 15 | 2 | 0.025 | −72 | 6.1 |
| Comparative Example 6 | 57 | 2 | 0.025 | −20 | 1.8 |
| Comparative Example 7 | 36 | 0.4 | 0.025 | −38 | 3.2 |
| Comparative Example 8 | 36 | 3.1 | 0.025 | −65 | 5.7 |
| Comparative Example 9 | 36 | 2 | 0 | −100 | 8.5 |
| Comparative Example 10 | 36 | 2 | 0.26 | −15 | 1.3 |

As can be clearly seen from Table 2, in Comparative Example 5, the residual stress of the ferroelectric film was large as 72 MPa in the absolute value, but in Example 11, the residual stress of the ferroelectric film was small as 21 MPa in the absolute value. Also, in Comparative Example 6, the residual stress of the ferroelectric film was large as 20 MPa in the absolute value, but in Example 12, the residual stress of the ferroelectric film was small as 18 MPa in the absolute value. From the results mentioned above, it can be understood that the residual stress of the ferroelectric film becomes small by making the contained ratio of the diol (propylene glycol) in the thickness adjusting film in the predetermined range.

Also, as can be clearly seen from Table 2, in Comparative Examples 7 and 8, the residual stress of the ferroelectric film was large as 38 MPa and 65 MPa in the absolute value, but in Examples 13 and 14, the residual stress of the ferroelectric film was small as 20 MPa and 15 MPa in the absolute value. From the results mentioned above, it can be understood that the residual stress of the ferroelectric film becomes small by making the contained ratio of the ultrapure water in the thickness adjusting film in the predetermined range.

Further, as can be clearly seen from Table 2, in Comparative Example 9, the residual stress of the ferroelectric film was large as 100 MPa in the absolute value, but in Example 15, the residual stress of the ferroelectric film was small as 35 MPa in the absolute value. In Comparative Example 10, the residual stress of the ferroelectric film was large as 15 MPa in the absolute value, but in Example 16, the residual stress of the ferroelectric film was small as 14 MPa in the absolute value. From the results mentioned above, it can be understood that the residual stress of the ferroelectric film becomes small by making the contained ratio of the polyvinylpyrrolidone (PVP) in the thickness adjusting film in the predetermined range.

UTILIZABILITY IN INDUSTRY

The ferroelectric film-attached silicon substrate of the present invention can be utilized for a composite electronic component such as a thin film capacitor, a capacitor, IPD, a capacitor for DRAM memory, a laminated capacitor, a gate insulator for a transistor, a nonvolatile memory, a pyroelectric infrared detection element, a piezoelectric element, an electrooptical element, an actuator, a resonator, a ultrasonic motor, or an LC noise filter element, etc.

EXPLANATION OF REFERENCE NUMERALS

10, 30: Ferroelectric film-attached silicon substrate
11: Substrate body
12, 32: PZT film (Ferroelectric film)

The invention claimed is:

1. A ferroelectric film-attached silicon substrate which comprises a PZT type ferroelectric film formed on a substrate body by a sol-gel process, a residual stress of which being −14 MPa to −31 MPa, and the ferroelectric film being crystal oriented in a (100) plane, and an average particle diameter of the crystal particles constituting the ferroelectric film being 500 nm to 700 nm.

2. The ferroelectric film-attached silicon substrate according to claim 1, wherein a thickness of the ferroelectric film is 860 nm or more and 10,060 nm or less.

3. The ferroelectric film-attached silicon substrate according to claim 1, wherein a diameter of the substrate body is 4 inches or more and 8 inches or less.

4. The ferroelectric film-attached silicon substrate according to claim 2, wherein a diameter of the substrate body is 4 inches or more and 8 inches or less.

5. The ferroelectric film-attached silicon substrate according to claim 1, further comprising a $SiO_2$ film and a $TiO_2$ lower electrode between the substrate body and the ferroelectric film.

6. The ferroelectric film-attached silicon substrate according to claim 1, wherein the ferroelectric film comprises an orientation control film and a thickness adjusting film made differently from each other.

7. The ferroelectric film-attached silicon substrate according to claim 1, wherein a thickness of the ferroelectric film is 1000 nm or more and 3000 nm or less.

* * * * *